United States Patent
Harada

(10) Patent No.: US 7,034,359 B2
(45) Date of Patent: Apr. 25, 2006

(54) VERTICAL MOS TRANSISTOR

(75) Inventor: Hirofumi Harada, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/867,906

(22) Filed: Jun. 15, 2004

(65) Prior Publication Data

US 2004/0262677 A1 Dec. 30, 2004

(30) Foreign Application Priority Data

Jun. 24, 2003 (JP) ............................. 2003-180111

(51) Int. Cl.
*H01L 29/78* (2006.01)

(52) U.S. Cl. ...................................... 257/330; 257/331

(58) Field of Classification Search ......... 257/327–334
See application file for complete search history.

(56) References Cited

U.S. PATENT DOCUMENTS 6,828,626 B1 * 12/2004 Oikawa et al. ............. 257/330

* cited by examiner

*Primary Examiner*—Cuong Nguyen
(74) *Attorney, Agent, or Firm*—Adams & Wilks

(57) ABSTRACT

A vertical MOS transistor has a high concentration drain region, a low concentration drain region disposed on the high concentration drain region, a body region disposed on the low concentration drain region, a high concentration body contact region disposed on the body region, and a high concentration source region formed on a portion of the body region outside of the high concentration body contact region. A first silicon trench passes through the body region and the high concentration source region and extends into the low concentration drain region. A second silicon trench is disposed in contact with the high concentration body contact region but not in contact with the high concentration source region. A gate insulator film is formed in each of the first and second silicon trenches. High concentration polycrystalline silicon gates are embedded within the respective first and second trenches and are surrounded by the gate insulator film.

20 Claims, 3 Drawing Sheets

VERTICAL MOS TRANSISTOR

BACKGROUND OF THE INVENTION

1. Field of the Invention

The present invention relates to a vertical MOS transistor having a trench structure.

2. Description of the Related Art

FIG. 2 shows a schematic cross sectional view of a vertical MOS transistor having a conventional trench structure. A semiconductor substrate is prepared in which a low concentration first conductivity type layer 2 is epitaxially grown on a first conductivity type high concentration substrate 1, which becomes a drain region. A second conductivity type diffusion region 3 that is referred to as a body region is formed from a surface of the semiconductor substrate by impurity injection and high temperature heat treatment at a temperature equal to or greater than 1,000° C. In addition, a first conductivity type, high concentration impurity region 7 that becomes a source region, and a second conductivity type, high concentration body contact region 8 for fixing the electric potential of the body region by ohmic contact are formed from the surface. The first conductivity type source region and the second conductivity type body contact region are normally taken as having the save electric potential here. Accordingly, a layout with surface contact like that of FIG. 2 may be used. The first conductive type high concentration impurity region 7 and the second conductivity type high concentration body contact region 8 are electrically connected by one contact hole formed on the source region and on the body contact region. Single crystal silicon is then etched, completely passing through the first conductive source region and forming a silicon trench 9. A gate insulator film 5 and polycrystalline silicon 6 that becomes a gate electrode and that contains a high concentration impurity are embedded within the silicon trench. Further, a first conductivity type, high concentration region of a rear surface of the semiconductor substrate is connected to a drain metallic electrode (not shown in FIG. 2).

A structure like that described above can be made to function as a vertical MOS transistor that controls current flowing from the drain region comprising the first conductivity type high concentration region of the rear surface side and the first conductivity type epitaxial region, to the source region comprising the first conductivity type high concentration region of the front surface side by the gate that is embedded within the trench, through the gate insulator film of a trench sidewall. This method can apply to both N-channel and P-channel types by reversing the conductivity types between N and P.

Further, vertical MOS transistors having this trench structure have characteristics whereby it is possible to apply planar direction microprocessing techniques because a channel is formed completely in the vertical direction. Accordingly, the surface area occupied by planar transistors has become smaller together with advances in microprocessing techniques, and there is a recent trend in which the amount of drain current flowing per unit surface area of an element has been increasing.

In practice, a MOS transistor having an increased channel width, an increased amount of drain current, and an arbitrary driving performance is made by turning back a cross sectional structure like that of FIG. 2 a plurality of times (refer to U.S. Pat. No. 4,767,722).

However, with this type of vertical MOS transistor structure, there is a high electric field at an edge of the drain side, in the vicinity of a gate oxide film of the body region that becomes the channel, when the drain voltage becomes equal to or greater than the withstand voltage of the vertical MOS transistor, avalanche damage develops, and current flows. For cases where this type of damage repeatedly develops due to static electricity, noise, or the like, defects or levels may develop in this portion, and degradation of the transistor characteristics may develop. A problem thus exists in the long term reliability of the transistor characteristics with this type of conventional structure.

SUMMARY OF THE INVENTION

According to the present invention, there is provided a vertical MOS transistor including: a first conductivity type semiconductor substrate that becomes a high concentration drain region; a first conductivity type epitaxial growth layer that becomes a low concentration drain region formed on the semiconductor substrate; a second conductivity type body region that is formed on the epitaxial growth layer; a second conductivity type high concentration body contact region that is formed on a front surface of a portion of the second conductivity type body region; a first conductivity type high concentration source region that is formed on a region of the front surface of the second conductivity type body region outside of the high concentration body contact region; a first silicon trench having a predetermined width, formed passing completely through the second conductivity type body region and the first conductivity type source region to a depth that reaches an internal portion of the first conductivity type epitaxial growth layer; a second silicon trench having a width that differs from that of the first silicon trench; a gate insulator film formed along a wall surface and a floor surface of the silicon trenches; and a high concentration polycrystalline silicon gate that is embedded within the trench, surrounded by the gate insulator film.

According to the structure described above, a depletion layer in a deep portion of the silicon trench immediately reaches the high concentration drain region and a charge is released for cases where static electricity or noise is input to the transistor. That is, avalanche damage is not caused on a side portion of the silicon trench on an interface between the body region and the low concentration drain region. As a result, the durability of the vertical MOS transistor is prolonged. This theory is discussed in detail below.

DETAILED DESCRIPTION OF THE PREFERRED EMBODIMENTS

Embodiments of the present invention are explained below based on the drawings. It should be noted that although examples are discussed in which N-type conductivity is used as a first conductivity type and P-type conductivity is used as a second conductivity type, the embodiments can also be similarly implemented with the reverse conductivity types.

Figure 1:
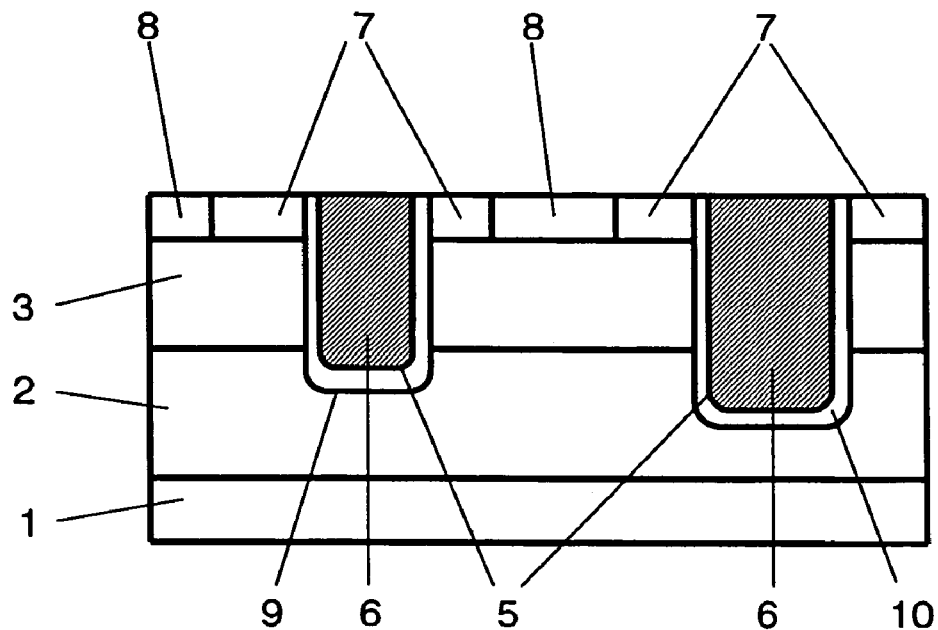
FIG. 1 is a cross sectional view of a vertical MOS transistor of the present invention.
Figure 2:
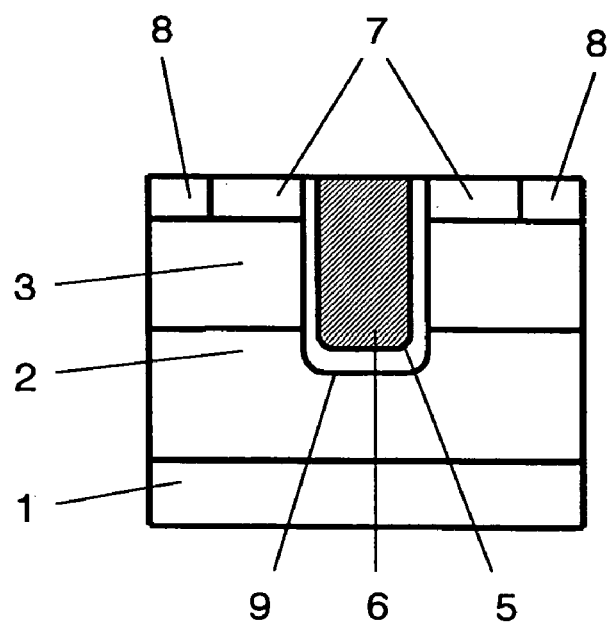
FIG. 2 is a cross sectional view of a conventional vertical MOS transistor.

FIG. 1 is a cross sectional view of an N-channel vertical MOS transistor. A low concentration N-type conductivity layer 2 (low concentration drain region) is made to grow epitaxially on an N-type conductivity high concentration substrate 1 that becomes a drain region, thus forming a semiconductor substrate. A P-conductivity type diffusion region 3 that becomes a body region is formed from the surface of the N-type conductivity layer 2 by impurity injection and high temperature heat treatment at a temperature equal to or greater than 1,000° C. In addition, an N-type conductivity high concentration impurity region 7 that becomes a source region, and a P-type conductivity high concentration body contact region 8 for fixing the electric potential of the body region 3 by ohmic contact are formed from the surface. Although not shown, the source region 7 and the body contact region 8 are connected by a metallic wiring, and taken as a source electrode. Further, a metallic wiring is formed on a rear surface side of the N-type conductivity high concentration substrate 1, and taken as a drain electrode.

As shown in FIG. 1, a first silicon trench 9 and a second silicon trench 10 that each reaches the N-type conductivity layer 2 are formed in substantial centers of two source regions 7. The depth and the width of the first silicon trench 9 and the second silicon trench 10 differ. A gate electrode 6 made from polycrystalline silicon is embedded in a trench internal portion of each of the first silicon trench 9 and the second silicon trench 10, through a gate insulator film 5 that is made from an oxide film. That is, two N-channel MOS transistors are formed.

Two trenches are thus prepared in the present invention. The trench having a narrow width and a shallow depth is mainly used as a driving transistor (used as a circuit for computations, output, or control), while the trench that is wide and deep is used as a long term reliability degradation countermeasure (used for preventing damage and degradation due to static electricity and noise).

Figure 3:
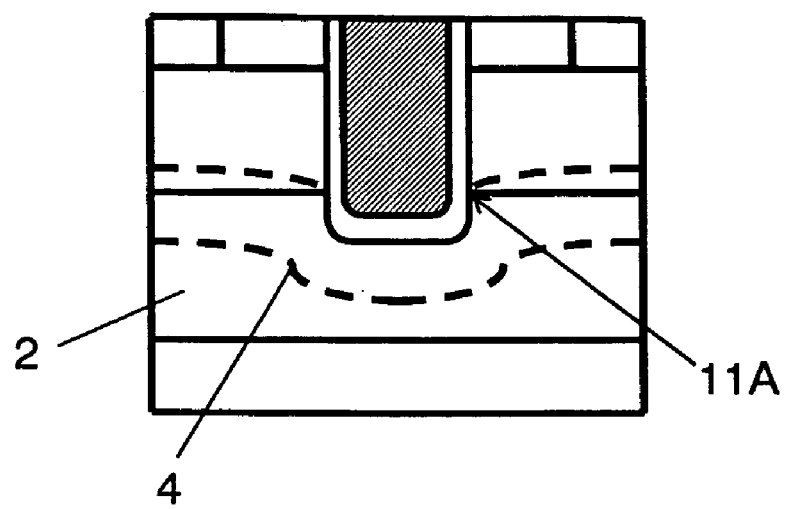
FIG. 3 is a cross sectional view that shows operation of a vertical MOS transistor when a trench is shallow.
Figure 4:
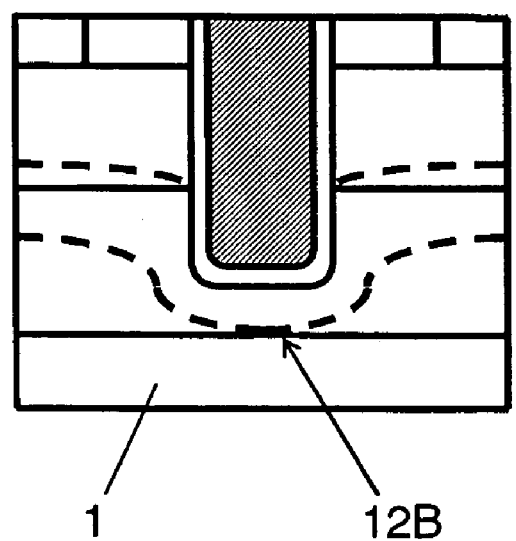
FIG. 4 is a cross sectional view that shows operation of a vertical MOS transistor when a trench is deep.

The two trenches 9 and 10 having different depths are used in the present invention, and the effect of such is explained based on FIG. 3 and FIG. 4. It is known that durability and damage characteristics during a high drain voltage normally differ between cases where a trench depth is shallow or deep. Incidentally, the gate voltage and the voltage between the body and the source here are both 0 V.

Referring to FIG. 3 a case where the silicon trench is shallow (the first silicon trench 9) is explained first. For cases where the voltage of the drain region 1 is made larger in a vertical MOS transistor like that of FIG. 3, a depletion layer 4 expands as shown by a dotted line segment 4 of FIG. 3 due to voltage between the drain region 1 and the body region 3, and voltage between the drain region 1 and the gate electrode 6. The depletion layer 4 of FIG. 3 is classified into three types relating to the expansion direction of the depletion layer 4 with respect to the voltages.

First, the depletion layer 4 directly below the first silicon trench 9 is formed having a depletion layer width that is determined by the voltage of the drain region 1 and the concentration of the epitaxial layer 2 (low concentration drain region), because the gate electrode 6 is 0 V.

Second, the depletion layer 4 in a junction between the epitaxial layer 2 and the body region 3 sufficiently separated from the first trench 9 is formed having a width that is determined by the voltage of the drain region 1 and the concentration of the epitaxial layer 2 and the body region 3.

Third, the depletion layer 4 on the body region 3 side does not easily expand at the same junction between the epitaxial layer 2 and the body region 3, and in the vicinity of the gate oxide film shown by a dot 11A of FIG. 3, because there is also influence from the voltage of the gate electrode 6 through the gate insulator film 5.

The highest electric field within the three types of depletion layers 4 in FIG. 3 is therefore at the junction between the epitaxial layer 2 and the body region 3 in the vicinity of the gate oxide film. Avalanche damage develops at this portion when there is an excess voltage applied to the drain electrode 1, and current flows.

Normally a low voltage is set as a usage condition in the specifications for a vertical MOS transistor so that an excess voltage like this is not applied. In actual use, this type of damage phenomenon often develops due to static electricity, various type of electrical noise, and the like. A small defect or level develops within the silicon of the body region 3 or in the gate insulator film 5 in a point 11A of FIG. 3 when this type of avalanche phenomenon occurs. If this type of defect or level develops in the gate insulator film 5 or in a current circuit, a carrier may enter and leave through the defect or level, and electric potential barriers develop in which the carrier is trapped. This may cause a leak current to increase, and may cause changes in the threshold voltage, in the current driver performance, and in the withstand voltage. The repeated development of this type of phenomenon may lead to characteristics fluctuating over time, and in the worst case, may lead to long term reliability failures in which transistor operation ceases.

On the other hand, if the depth of the silicon trench is made deeper (the case of the second silicon trench 10) as in FIG. 4, the depletion layer 4 immediately below the silicon trench 10 contacts the drain region 1 (high concentration substrate 1) for cases where the voltage of the drain region 1 is made large, and it becomes difficult for the depletion layer 4 to expand further. The electric field at a point 12B of FIG. 4 therefore becomes high. If the electric field of the point 12B becomes a higher electric field than that of the point 11A of FIG. 3, then current flows in an interface between the low concentration drain region 2 (epitaxial layer 2) and the drain region 1 (high concentration substrate 1) when an excess voltage is applied to the drain region, differing from FIG. 3, due to avalanche damage or Zener damage.

This location is not one at which the avalanche damage leads to degradation of the junction or the gate oxide film as described above, and therefore the avalanche damage does not easily cause fluctuations in characteristics such as the leak current and the threshold voltage. In addition, it becomes very difficult for degradation to occur due to Zener damage. That is, there is superior long term reliability for cases like that of FIG. 4 in which the trench depth is deep and damage develops at the interface between the epitaxial layer and the high concentration substrate. However, there is a large overlap capacitance between the gate electrode 6 and the (low concentration) drain region 2 with the structure of FIG. 4 compared to that of FIG. 3. Accordingly, the structure of FIG. 4 also has a disadvantage in that the high frequency characteristics degrade.

Transistors having different silicon trench depths are formed on the same substrate with the present invention, as shown in FIG. 1. In addition to a main transistor for mainly determining the manufactured product characteristics, a portion having a lower withstand voltage than the junction withstand voltage is intentionally formed in the vicinity of the gate by forming the silicon trench 10 having a deep trench like that of FIG. 4 so that junction damage does not occur in the vicinity of the gate insulator film 5 of the transistor with the silicon trench 9 shown in FIG. 3 that has a shallow trench. An effect is thus obtained in which fluctuations in the characteristics are prevented as operation failures due to long term usage. Further, portions of this type are only formed in a portion of the manufactured products, and therefore there is substantially no interference in the high frequency characteristics.

Further, a micro loading effect during silicon dry etching when forming the trench is utilized in forming the silicon trenches 9 and 10 that have different depths on the same semiconductor substrate. That is, ion penetration for etching is obstructed when the silicon trench width is narrow, and the etching rate becomes slow, and the etching depth thus becomes shallow. The trench width of the main transistor portions that determine the manufactured product characteristics is made narrow, and the trench width of the portions intentionally given a low withstand voltage is made wide. The silicon trenches 9 and 10 having different depths can thus be achieved without increasing the number of manufacturing processes.

Although depending upon the etching conditions and the target trench depth, this micro loading effect is observed from a point where the width of silicon exposed during etching is equal to or less than 1.0 µm The effect becomes pronounced at a silicon exposure width equal to or less than 0.8 µm. For example, the difference in the etching depth between an etching width of 0.8 µm and an etching width equal to or greater than 1.3 µm is approximately 0.2 µm.

When forming a shallow trench like that of the first silicon trench 9 (for cases where the aim is to make the width during etching shallow), it is preferable that the trench depth be equal to or less than 0.8 µm. When aiming for a deep trench like that of the second silicon trench 10, it is preferable that the trench depth be equal to or greater than 1.5 µm. Further, it is necessary to deposit polycrystalline silicon thickly in order to embed the trench when the trench width becomes large. For example, for a case where the width of the first silicon trench 9 is 0.8 µm, and the width of the second silicon trench 10 is 1.8 µm, the trenches of the first silicon trench 9 and the second silicon trench 10 can be made flat by depositing polycrystalline silicon at a thickness equal to or greater than 1.8 µm, matching the second silicon trench 10 whose width is large.

Figure 5:
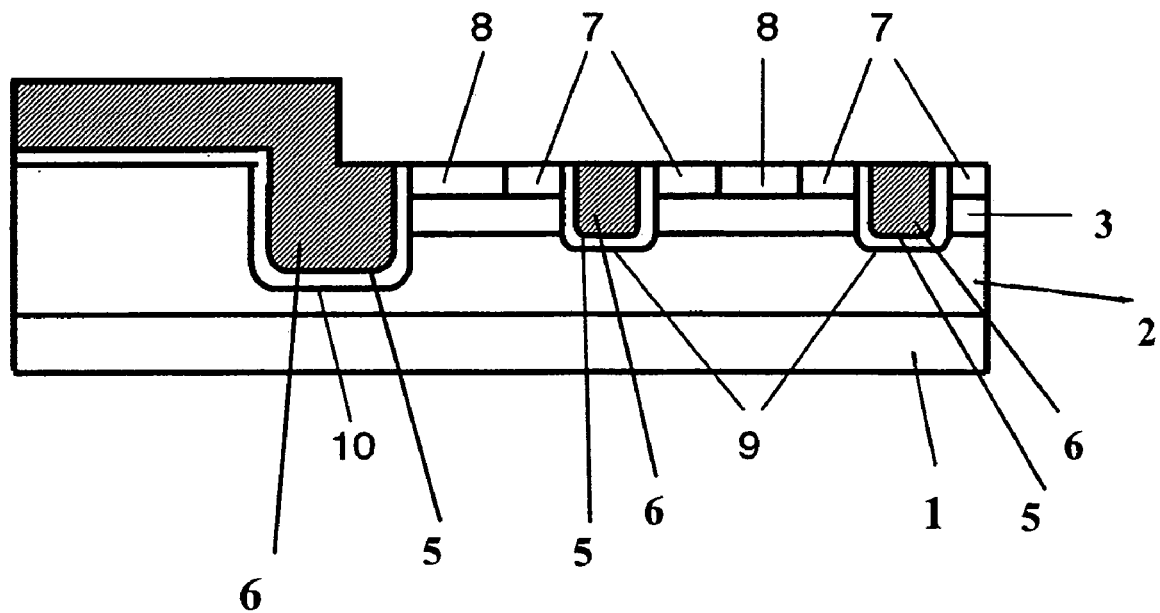
FIG. 5 is a cross sectional view of an embodiment of a vertical MOS transistor of the present invention.

Another embodiment or the present invention is explained next based on FIG. 5. In FIG. 5, the first silicon trench 9 having a shallow trench and a narrow width is disposed between main transistor cells that determine driving performance, and the second silicon trench 10 having a wide trench width is disposed in an external circumferential portion of a manufactured chip. In FIG. 5, a high concentration source region is not disposed connected to the second silicon trench 10. Accordingly, this portion does not contribute in any manner to transistor operation. Even if it is assumed that degradation develops due to avalanche damage, there is an advantage in that there is no influence imparted to transistor performance.

Figure 6:
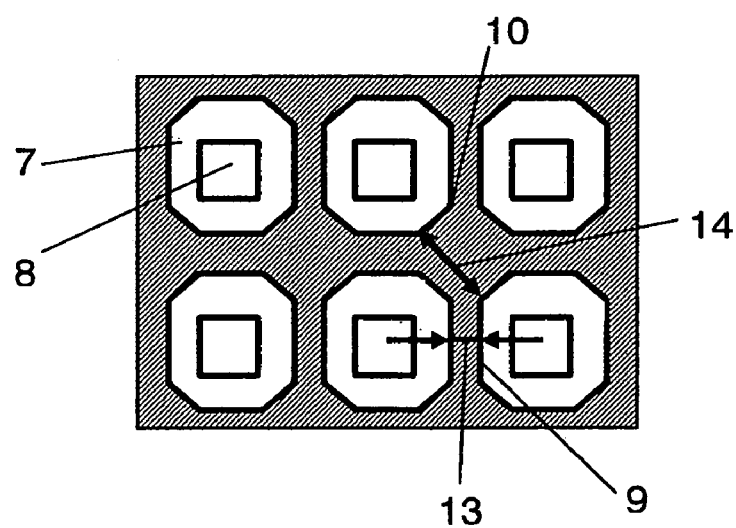
FIG. 6 is a planar view of another embodiment of a vertical MOS transistor of the present invention.

In addition, another embodiment is shown in FIG. 6. FIG. 6 is a planar view that shows a substrate surface of one vertical MOS transistor. A slanted line portion of FIG. 6 shows the first silicon trench 9 and the second silicon trench 10 that are formed in the substrate surface. Trenches are formed here by etching, leaving six island shape semiconductor substrate surfaces. The silicon gate electrodes 6 are embedded in the trenches through gate insulator films (oxide films). That is, the source regions 7 are formed in six locations in a stripe shape, surrounding the body contact region 8. The body region 3, the low concentration drain region 2, and the high concentration drain region 1 are of course formed below the body contact regions 8 and the source regions 7. In addition, the low concentration drain region 2 and the high concentration drain region 1 are also formed below the first silicon trench 9 and the second silicon trench 10.

A structure is employed in this example in which the first silicon trench 9 and the second silicon trench 10 are disposed between the main transistor cells that determine the driver performance (the transistor cells each comprise the source region 7 and the body contact region 8 in FIG. 6). The transistor cells take on a shape where corners of the rectangular transistor cells (comprising the source region 7 and the body contact region 8) are chamfered, as shown in FIG. 6. This is a structure in which the channel width is made large by repeatedly disposing these shapes. The source region 7 and the body contact region 8 are electrically connected, and moreover, each of the source regions 7 and the body contact regions 8 are electrically connected. The channel width becomes a length in which the outer circumferential lengths of each of the source regions 7 are added together. Trenches between adjacent (closest) transistor cells are taken as the narrow width first silicon trench 9, and current mainly flows here. In contrast, silicon trenches between transistor cells that are arranged diagonally are taken as the wide width second silicon trenches 10. This is clear from FIG. 6. That is, these are the wide width second trenches. A length A of reference numeral 13 and a length B of reference numeral 14 of FIG. 6 always have the following relationship in this type of structure.

A<B

That is, the depth of the silicon trenches between the source regions 7 of the closest transistor cells becomes shallow due to dry etching, and the depth of the silicon trenches between the source regions 7 of diagonally opposing transistor cells becomes deep due to dry etching.

Current also flows in sidewalls of the second silicon trench 10, similar to sidewalls of the first trench, but the ratio is small compared to the entire channel width, and therefore there is little influence with respect to characteristic changes even if this portion degrades due to the avalanche phenomenon or the like.

The fact that the surface area ratio occupied by the second silicon trench 10 within one chip becomes large compared to that of FIG. 5, and the fact that the surface area is distributed uniformly within the chip are advantages of this structure. Accordingly, much current due to damage developing by an excess drain voltage can be uniformly absorbed within the chip. This leads, for example, to preventing local generation of heat and changes in characteristics, and damage, due to the heat.

As a second point, even for cases where there is dispersion in the trench depth within the chip, the damaged portions can always be determined in the second silicon trench 10. For example, for a case where the second trench is only in the outer periphery portion of the chip, as in FIG. 5, and the trench depth at the center of the chip is deep due to trench depth dispersions, the relationship between the depth of the first trench and the depth of the second trench may reverse. However, with a structure like that of FIG. 6, the second silicon trench 10 always exists near the first silicon trench 9. A state in which the depth of the second silicon trench 10 is relatively deep can therefore be maintained even for cases where there is large dispersion in the etching depth.

In addition, in FIG. 6 it is preferable that the sidewall surface of the first silicon trench 9 be a single crystal 100 surface, and it is preferable that the sidewall surface of the second silicon trench 10 be a single crystal 110 surface. In a silicon substrate whose main surface is a 100 surface, this can easily be achieved by adjusting the planar orientation of the transistor cells of FIG. 6.

In general, it is known that a phenomenon develops in which a gate oxide film becomes thicker, mobility becomes lower, and the threshold voltage becomes higher, and the driver performance becomes lower for MOS transistors whose channel surface is a 110 surface. This is due to differences in the molecular density of the crystal surface, and the like. In a vertical MOS transistor, the driver performance of the transistor driven by the second silicon channel 10 becomes low due to adjusting the trench sidewall surface, that is adjusting the channel surface, by a method like that described above. Any influence on degradation of characteristics due to the avalanche phenomenon or the like in this portion can therefore be made very small.

The width between diagonally opposing transistor cells also becomes larger than the first channel width for cases in which the transistor cells are given a rectangular shape in FIG. 6, and therefore effects similar to those described up to this point can also be obtained. However, other undesirable phenomenon such as degradation of leak characteristics due to stress concentrations in corner portions may develop, and this configuration is not suitable to be employed as a cell structure. That is, the structure of FIG. 6, in which the corner portions of the transistor cells are chamfered, possesses an advantage in which characteristic degradation due to sharpening of the corner portions is prevented before it occurs.

By thus employing structures like those of FIG. 5 and FIG. 6 in the present invention, degradation in the characteristics of a vertical MOS transistor can be prevented, and good long term reliability can be ensured. The structures of FIG. 5 and FIG. 6 can of course also be combined, thus making the present invention very effective.

Degradation of the characteristics of, and failures in the long term reliability of, a vertical MOS transistor can be prevented according to the present invention, and a high reliability vertical MOS transistor can be provided.

What is claimed is:

1. A vertical MOS transistor comprising:
   a first-conductivity type semiconductor substrate forming a high concentration drain region;
   a first-conductivity type epitaxial growth layer forming a low concentration drain region disposed on the semiconductor substrate;
   a second-conductivity type body region disposed on the epitaxial growth layer;
   a second-conductivity type high concentration body contact region disposed on a front surface of a portion of the body region;
   a first-conductivity type high concentration source region formed on a region of the front surface of the body region outside of the high concentration body contact region;
   a first silicon trench passing completely through the body region and the high concentration source region to a depth that reaches an internal portion of the epitaxial growth layer;
   a second silicon trench disposed so that the high concentration body contact region contacts the second silicon trench and the high concentration source region does not contact the second silicon trench;
   a gate insulator film formed along a wall surface and a floor surface of each of the first and second silicon trenches; and
   high concentration polycrystalline silicon gates embedded within the respective first and second trenches and surrounded by the gate insulator film.

2. A vertical MOS transistor according to claim 1 wherein the first and second silicon trenches have different widths.

3. A vertical MOS transistor according to claim 1 wherein the first and second silicon trenches have different widths and extend to different depths.

4. A vertical MOS transistor according to claim 3 wherein the width and the depth of the second silicon trench are larger than the width and the depth, respectively, of the first silicon trench.

5. A vertical MOS transistor comprising:
   a first-conductivity type semiconductor substrate forming a high concentration drain region;
   a first-conductivity type epitaxial growth layer forming a low concentration drain region disposed on the semiconductor substrate;
   a second-conductivity type body region disposed on the epitaxial growth layer;
   a second-conductivity type high concentration body contact region disposed on a front surface of a portion of the body region;
   a first-conductivity type high concentration source region formed on a region of the front surface of the body region outside of the high concentration body contact region;
   a first silicon trench passing completely through the body region and the high concentration source region to a depth that reaches an internal portion of the type epitaxial growth layer;
   a second silicon trench formed at an outermost circumference of a plurality of unit transistor cells arranged planarly and repeatedly, the unit transistor cells comprising the high concentration body contact region and the high concentration source region;
   a gate insulator film formed along a wall surface and a floor surface of each of the first and second silicon trenches; and
   high concentration polycrystalline silicon gates embedded within the respective first and second trenches and surrounded by the gate insulator film.

6. A vertical MOS transistor according to claim 5 wherein the high concentration body contact region contacts an inner side of the second silicon trench.

7. A vertical MOS transistor according to claim 1 wherein a width of the second silicon trench is larger than a width of the first silicon trench.

8. A vertical MOS transistor according to claim 5 wherein the first and second silicon trenches have different widths.

9. A vertical MOS transistor according to claim 5 wherein a width of the second silicon trench is larger than a width of the first silicon trench.

10. A vertical MOS transistor according to claim 5 wherein the first and second silicon trenches have different widths and extend to different depths.

11. A vertical MOS transistor according to claim 10 wherein the width and the depth of the second silicon trench are larger than the width and the depth, respectively, of the first silicon trench.

12. A vertical MOS transistor comprising:
a first-conductivity type semiconductor substrate forming a high concentration drain region;
a first-conductivity type epitaxial growth layer forming a low concentration drain region disposed on the semiconductor substrate;
a second-conductivity type body region disposed on the epitaxial growth layer;
a second-conductivity type high concentration body contact region disposed on a front surface of a portion of the body region, the high concentration body contact region having a generally rectangular cross-section;
a first-conductivity type high concentration source region surrounding the high concentration body contact region and formed on a region of the front surface of the body region outside of the high concentration body contact region, the high concentration source region having an outer circumference with eight sides including a first group of four sides disposed generally parallel to the high concentration body contact region and a second group of four sides not disposed generally parallel to the high concentration body contact region;
a first silicon trench passing completely through the body region and the high concentration source region to a depth that reaches an internal portion of the epitaxial growth layer, the first silicon trench contacting the first group of four sides of the high concentration source region;
a second silicon trench contacting the second group of four sides of the high concentration source region;
a plurality of unit cells each having an octagonal shape and comprising the high concentration body contact region and the high concentration source region, the unit cells being arranged repeatedly and planarly through the first and second silicon trenches;
a gate insulator film formed along a wall surface and a floor surface of each of the first and second silicon trenches; and
high concentration polycrystalline silicon gates embedded within the respective first and second trenches and surrounded by the gate insulator film.

13. A vertical MOS transistor according to claim 12 wherein a crystalline surface of a trench sidewall of the first silicon trench is a 100 surface, and a crystalline surface of a trench sidewall of the second silicon trench is a 110 surface.

14. A vertical MOS transistor according to claim 12 wherein the first and second silicon trenches have different widths.

15. A vertical MOS transistor according to claim 12 wherein a width of the second silicon trench is larger than a width of the first silicon trench.

16. A vertical MOS transistor according to claim 12 wherein the first and second silicon trenches have different widths and extend to different depths.

17. A vertical MOS transistor according to claim 16 wherein the width and the depth of the second silicon trench are larger than the width and the depth, respectively, of the first silicon trench.

18. A vertical MOS transistor comprising:
a first-conductivity type semiconductor substrate forming a high concentration drain region;
a first-conductivity type epitaxial growth layer forming a low concentration drain region disposed on the semiconductor substrate;
a second-conductivity type body region disposed on the epitaxial growth layer;
a second-conductivity type high concentration body contact region disposed on a front surface of a portion of the body region;
a first-conductivity type high concentration source region formed on a region of the front surface of the body region outside of the high concentration body contact region;
a first silicon trench passing completely through the body region and the high concentration source region to a depth that reaches an internal portion of the epitaxial growth layer, the first silicon trench having a width equal to or greater than 0.8 µm;
a second silicon trench having a width equal to or greater than 1.5 µm;
a gate insulator film formed along a wall surface and a floor surface of each of the first and second silicon trenches; and
high concentration polycrystalline silicon gates embedded within the respective first and second trenches and surrounded by the gate insulator film.

19. A vertical MOS transistor comprising:
a high concentration drain region;
a low concentration drain region disposed on the high concentration drain region;
a body region disposed on the low concentration drain region;
a high concentration body contact region disposed on the body region;
a high concentration source region formed on a portion of the body region outside of the high concentration body contact region;
a first silicon trench passing through the body region and the high concentration source region and extending into the low concentration drain region;
a second silicon trench disposed in contact with the high concentration body contact region but not in contact with the high concentration source region;
a gate insulator film formed in each of the first and second silicon trenches; and
high concentration polycrystalline silicon gates embedded within the respective first and second trenches and surrounded by the gate insulator film.

20. A vertical MOS transistor according to claim 19 wherein each of the high concentration drain region, the low concentration drain region and the high concentration source region is of a first conductivity type; and wherein each of the body region and the body contact region is of a second-conductivity type different from the first-conductivity type.

* * * * *